United States Patent [19]

Peres et al.

[11] Patent Number: 4,942,495
[45] Date of Patent: Jul. 17, 1990

[54] ELECTROSTATIC PROTECTION DEVICE FOR ELECTRONIC CARDS

[75] Inventors: Philippe Peres, Gardanne; Vincent Deveaud, Trets, both of France

[73] Assignee: Gemplus Card International, Aix En Provence, France

[21] Appl. No.: 261,176

[22] Filed: Oct. 21, 1988

[30] Foreign Application Priority Data

Oct. 23, 1987 [FR] France ................................ 87 14669

[51] Int. Cl.⁵ .............................................. H05F 3/02
[52] U.S. Cl. .................................................. 361/220
[58] Field of Search .............................. 361/212, 220

[56] References Cited

U.S. PATENT DOCUMENTS 4,322,777 3/1982 Ueta et al. ..................... 361/212 X
4,617,605 10/1986 Obrecht et al. ..................... 361/220

FOREIGN PATENT DOCUMENTS 762743 12/1944 Fed. Rep. of Germany .
3011465 10/1980 Fed. Rep. of Germany .
3502421 8/1986 Fed. Rep. of Germany .
2046539 11/1980 United Kingdom .

Primary Examiner—Brian W. Brown
Attorney, Agent, or Firm—Roland Plottel

[57] ABSTRACT

In an electrostatic protection device for electronic cards, the electronic card has a module bearing, on one of its faces, a network of conducting tracks to which at least one integrated circuit is connected. Each contact is close to a contact at a reference potential. The contact bears, on its periphery, metal sharp-pointed proturberances placed so as to face other metal protuberances borne by the contacts so as to favor the formation of electric arcs between two facing protuberances.

2 Claims, 1 Drawing Sheet

ELECTROSTATIC PROTECTION DEVICE FOR ELECTRONIC CARDS

BACKGROUND OF THE INVENTION

1. Field of the Invention

An object of the present invention is a device for the protection, against electrostatic discharges, of electronic circuits mounted in modules and inserted into a portable, electrically insulating support such as an electronic card.

A module generally consists of integrated circuits, such as random-access or read-only memories, microprocessors or logic circuits connected to a support by using either a so-called wire technology or a so-called TAB (tape automatic bonding) technology.

The support has, on one of its faces, a network of conducting tracks. The integrated circuit or circuits are mounted on this face. Small conducting wires are respectively soldered to the input/output terminals of the integrated circuit and to the corresponding conducting track of the support.

On the other face of the support, there are contacts. These contacts are accessible from the outside and are each connected to a conducting track. They are used to provide electrical connection between the integrated circuits and the external elements designed to enter into dialogue with them. These contacts are used to transmit to the integrated circuits all the voltages applied thereto by means of the conducting tracks and the wires.

2. Description of the Prior Art

Generally, a drop of thermosetting resin is deposited on the integrated circuits and on their connections with the support in order to protect them. The set forming the integrated circuits and the support constitutes the module which is inserted in an insulating material of the size of an electronic card.

The integrated circuits used in these electronic cards are designed to memorize, protect and, if necessary, make computations on, data coming from outside or data memorized by these cards. They are made with MOS (metal oxide semiconductor) or CMOS (complementary MOS) technology. They are sensitive to electrostatic charges for these charges can damage or even destroy the input and output structures and the supplies by breakdown of oxide or any other irreversible phenomenon.

The electrostatic charges arise on the external contacts under the effect of various frictional forces to which the card may be subjected, or else by contact with a person who is himself or herself charged with a high potential.

Various methods have been used to protect integrated circuits against overvoltages for which they are not designed. In a known method, each external contact of the module is systematically brought close to a contact carried to the reference potential.

It is known that the breakdown voltage of air is in the range of 100,000 volts per centimeter. The contacts are generally at a distance of a few hundreds of micrometers from each other. When the card or module undergoes an electrostatic discharge, the fact of bringing each contact into close proximity with a contact carried to the reference potential causes an electrical arc between the contact exposed to the discharge and the contact carried to the reference potential. The overvoltage is thus attenuated and is not entirely applied to the integrated circuits.

An object of the present invention is to further reduce the overvoltage applied to the contacts in proposing a device that favors arc effects and reduces the minimum voltage needed to have an arc.

SUMMARY OF THE INVENTION

Thus, an object of the present invention is an electronic card having a module consisting of:

an insulating support carrying, on one of its faces, a network or web of conducting tracks and, on the other face, electrical contacts accessible from the outside placed so that each conducting track is connected to a contact and so that each contact is close to a contact at a reference potential:

at least one integrated circuit, the input and output terminals of which are connected to the network of conducting tracks, wherein the contact taken to the reference potential bears, on its periphery, several metal protuberances placed so as to face other metal protuberances borne by the other contacts so as to protect the integrated circuit or circuits against electrostatic discharges.

BRIEF DESCRIPTION OF THE DRAWINGS

Other features and advantages of the invention will emerge from the following description, made with reference to the following drawings, of which.

DESCRIPTION OF A PREFERRED EMBODIMENT

Figure 1:
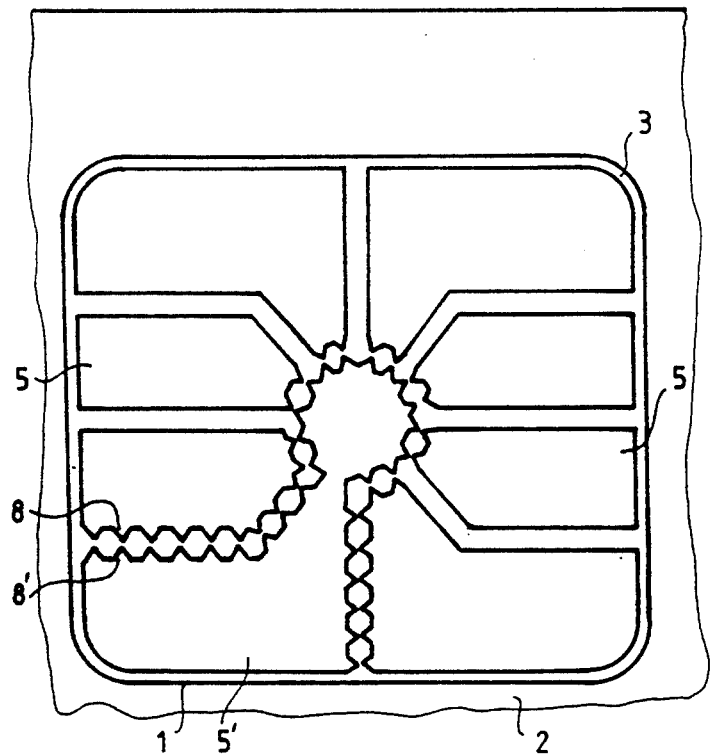
FIG. 1 shows a partial top view of an electronic card bearing a module that includes the protection device according to the invention.

The card shown in FIG. 1 consists of a module 1 inserted into a support 2 having a credit card format, for example.

Figure 2:
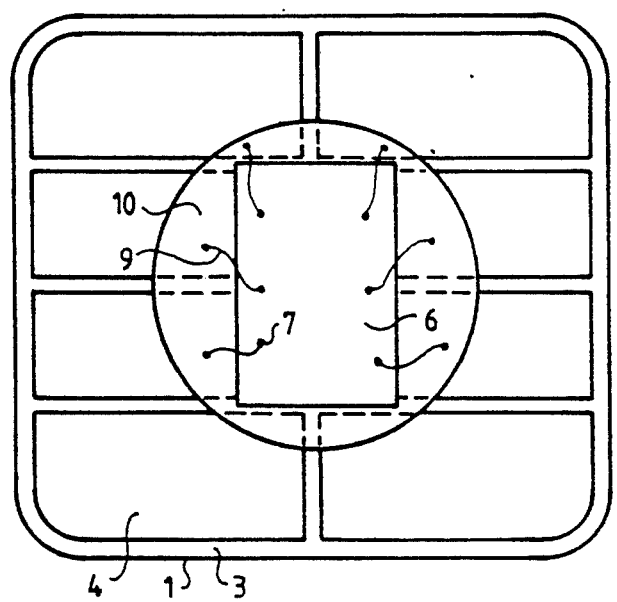
FIG. 2 shows a top view of the same module.

The module 1 consists of an insulating support 3 carrying, on its lower surface, a network or web of conducting tracks 4 which can be seen in FIG. 2. Each conducting track is electrically connected to a contact 5 borne by the other face of the support 3 and visible in FIG. 1. These contacts are accessible from the outside. Each contact 5 is close to a contact 5' at the reference potential. This contact 5' is also electrically connected to a conducting track 4 at the reference potential.

At least one integrated circuit 6 is mounted on the support 3 on the face carrying the network of conducting tracks. The input and output terminals 7 of the integrated circuit are connected to the conducting tracks 4 by means of a small wire 9. A drop of resin 10 is deposited on the integrated surface 6 and on the connection wires in order to protect them.

On the other face of the support 3, there are the contacts 5 and 5' which can be reached from the outside. They enable connection between the card and the apparatus designed to undertake dialogue with it.

The nominal distance between two contacts is a few hundreds of micrometers. It is between a contact 5 and the contact 5' that there will arise an electrical arc when the card has stored static electricity.

The invention proposes to reduce the voltage needed to create an electric arc in order to protect the integrated circuit against overvoltage. Since the breakdown voltage of air is 100,000 volts per centimeter, if the distance between a contact 5 and the contact 5' is 500 micrometers, the breakdown voltage between these two contacts will be 5,000 volts. To reduce this voltage, the invention proposes to reduce the nominal distance between a contact 5 and the contact 5'. For this, the contact 5' has several metal protuberances 8' on its periphery, facing other metal protuberances 8, carried by the contacts 5. These metal protuberances 8 and 8', placed in a facing position, reduce the nominal distance between the contacts 5 and 5', and reduce the minimal voltage to obtain an arc. Furthermore, the pointed shape of the protuberances favors the arc effect. This is the principle lying behind the spark arrester.

In our example, the nominal distance between the end of two facing protuberances will be less than 100 micrometers. The breakdown voltage will be less than 1000 volts. This voltage may be easily supported by an integrated circuit.

It is advisable to place a maximum number of protuberances on the contacts 5 and 5' for, in being constantly and repeatedly subjected to the effect of the electric arcs, the protuberances may be damaged.

The contacts with their protuberances are made by the photoetching of a metallic layer deposited on the support.

Protection of this type against electrostatic discharges considerably increases the lifetime of an electronic card.

What is claimed is:

1. An electronic card having a module comprising
   an insulating support (3) carrying, on one of its faces, a network of conducting tracks (4) and, on the other face, electrical contacts (5—5') accessible from the outside placed so that each conducting track (4) is connected to a contact (5) and so that each contact (5) is close to a contact (5') at a reference potential:
   at least one integrated circuit (6), the input and output terminals of which (7) are connected to the network of conducting tracks (4), the contact at the reference potential (5') bears, on its periphery, one or more metal protuberances (8') facing other metal protuberances (8) borne by the other contacts (5) so as to protect the integrated circuit or circuits against electrostatic discharges; the distance between two facing protuberances (8—8') is smaller than the nominal distance between the contact carried to the reference potential (5') and the other contacts (5); the contacts (5 and 5') have several of said protuberances (8 and 8'), said protuberances having ends facing each other and the distance between the facing ends of said protuberances (8 and 8') is less than 100 micrometers; and wherein said reference potential contact (5') has a portion with said plurality of protuberances which is centrally located, and the electrical contacts (5) are located with their protuberances facing the plurality of protuberances surrounding said centrally located portion.

2. An electronic card having a module comprising
   an insulating support (3) carrying, on one of its faces, a network of conducting tracks (4) and, on the other face, electrical contacts (5—5') accessible from the outside placed so that each conducting track (4) is connected to a contact (5) and so that each contact (5) is close to a contact (5') at a reference potential;
   at least one integrated circuit (6), the input and output terminals of which (7) are connected to the network of conducting tracks (4), the contact at the reference potential (5') bears, on its periphery, one or more metal protuberances (8') facing other metal protuberances (8) borne by the other contacts (5) so as to protect the integrated circuit or circuits against electrostatic discharges; the distance between two facing protuberances (8—8') is smaller than the nominal distance between the contact carried to the reference potential (5') and the other contacts (5); the contacts (5 and 5') have several of said protuberances (8 and 8'), said protuberances having ends facing each other; and wherein said reference potential contact (5') has a portion with said plurality of protuberances which is centrally located, and the electrical contacts (5) are located with their protuberances facing the plurality of protuberances surrounding said centrally located portion.

* * * * *